(12) United States Patent
Gutcher et al.

(10) Patent No.: US 7,876,861 B2
(45) Date of Patent: Jan. 25, 2011

(54) METHODS, APPARATUS, AND SYSTEMS FOR DETERMINING 1T STATE METRIC DIFFERENCES IN AN NT IMPLEMENTATION OF A VITERBI DECODER

(75) Inventors: Brian K. Gutcher, Loveland, CO (US); Kripa Venkatachalam, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 925 days.

(21) Appl. No.: 11/696,300

(22) Filed: Apr. 4, 2007

(65) Prior Publication Data

US 2008/0247493 A1    Oct. 9, 2008

(51) Int. Cl.
*H04L 27/06* (2006.01)
(52) U.S. Cl. ...................................... 375/341
(58) Field of Classification Search .................. 375/316, 375/340, 341
See application file for complete search history.

(56) References Cited

U.S. PATENT DOCUMENTS

| | | | | |
|---|---|---|---|---|
| 6,445,755 | B1 * | 9/2002 | Chung et al. | 375/341 |
| 6,484,283 | B2 * | 11/2002 | Stephen et al. | 714/786 |
| 6,999,532 | B2 | 2/2006 | Kuo et al. | |
| 2005/0066259 | A1 * | 3/2005 | Park et al. | 714/795 |
| 2005/0268210 | A1 * | 12/2005 | Ashley et al. | 714/792 |

OTHER PUBLICATIONS

Hagenauer, J. et al.; *A Viterbi Algorithm With Soft-Decision Outputs and its Appilcations*;1989; IEEE.
Black, Peter J. et al.; *A 140-Mb/s, 32-State, Radix-4 Viterbi Decoder*, IEEE Journal of Solid-State Circuits; Dec. 1992; pp. 1877-1885.
Yeo, Engling et al.; *500Mb/s Soft Output Viterbi Decoder*; ESSRIC 2002; pp. 523-526.
Yeo, Engling et al.; *500Mb/s Soft Output Viterbi Decoder*; IEEE Journal of Soild-State Circuits; Jul. 2003; pp. 1234-1241.

* cited by examiner

*Primary Examiner*—Kevin M Burd
(74) *Attorney, Agent, or Firm*—Duft Bornsen & Fishman, LLP (57) ABSTRACT

Methods, apparatus, and systems for generating bit-wise reliability information using a soft output Viterbi algorithm ("SOVA") in an nT Viterbi decoder implementation devoid of 1T metric information. At each nT clock pulse 1T equivalent metric values are determined from the current nT metric information. 1T equivalent metric information is determined as values that sum to the corresponding nT metric information. Subtraction is then used to determine state metric difference information from the 1T equivalent metric values. The state metric difference information may then be used to estimate log likelihood ratio information for use in the SOVA algorithm to determine bit-wise reliability information.

10 Claims, 7 Drawing Sheets

FIG. 5 General Trellis Diagram for 4 State 1T Viterbi
(prior art)

FIG. 6  Two Steps on 4 State 1T Viterbi
(prior art)

FIG. 7 One Step on 4 State 2T Viterbi Using 1T Equivalent Metric Values

METHODS, APPARATUS, AND SYSTEMS FOR DETERMINING 1T STATE METRIC DIFFERENCES IN AN NT IMPLEMENTATION OF A VITERBI DECODER

BACKGROUND

1. Field of the Invention

The invention relates to methods, apparatus, and systems utilizing Viterbi algorithms in a digital channel decoder. More specifically the invention relates to methods, apparatus, and systems for determining 1T state metric differences from an nT implementation of a Viterbi decoder devoid of 1T metric information.

2. Discussion of Related Art

In most present digital communication channels, information is encoded in a manner to improve reliability of the transmitted information in the presence of imperfect or noisy communication channels. Exemplary of such communication channels are digital voice and data communication channels utilizing, for example, RF modulation for transmission of digital data. Another exemplary application of such digital channels are storage devices with read/write channels that write digital information using optical or magnetic modulation techniques for later recovery through a corresponding read channel.

One common decoding algorithm is known as the Viterbi algorithm. Broadly speaking, the Viterbi algorithm is a dynamic programming algorithm that determines the most likely sequence of states that result in a sequence of observed events in the received signal. This most likely sequence of states then defines the decoded symbol based on the path of most likely values of the observed events. In general, the Viterbi decoder determines the most likely sequence of events that may be the underlying cause of an observed sequence of events. In other words, the Viterbi decoder determines the most likely sequence of encoded data bits represented by a received sequence of modulated events.

Improvements to the Viterbi algorithm known as the soft output Viterbi algorithm ("SOVA") improve upon prior algorithms by including reliability or probability information for each decoded bit of the decoded symbol and, by accumulating this bit-wise reliability or probability information, a reliability or probability value associated with the most likely decoded symbol can be generated. Basic concepts of the SOVA techniques and common applications thereof are well known to those of ordinary skill in the art and are notoriously disclosed by Hagenauer and Hoeher in 1989 in the paper entitled "A Viterbi Algorithm With Soft-Decision Outputs and its Applications" (IEEE 1989 and incorporated herein by reference). The SOVA algorithms utilize branch metric information associated with each branch from the first state to each of two subsequent, potential follow-on states to determine the most likely branch for a next sensed event. Hagenauer and Hoeher first taught that the difference in accumulated branch metric information between the most likely and second most likely paths of the Viterbi detector in response to each sensed event is a useful approximation of the log-likelihood ratio ("LLR") used in the SOVA techniques to determine reliability of the surviving path (e.g., reliability of the decoded bit). This state metric difference ("SMD") is therefore used to implement SOVA techniques in present Viterbi decoders.

Those of ordinary skill in the art will readily recognize that the state metric and branch metric information discussed herein, or simply discussed herein as metric information, is also sometimes referred to as "path metric" information.

In earlier Viterbi algorithm state machines, each bit or received event is received or sensed on a corresponding cycle of an applicable clock signal. The clock signal generally cause a transition of the state machine to determine the most likely bit value for the sensed event based on past sensed events and corresponding branch metric information. In other words, each clock cycle of the Viterbi algorithm state machine corresponds to decoding of one bit of the encoded symbol. Branch metric information is therefore encoded in association with each possible transition corresponding to each clock cycle operable in the Viterbi algorithm state machine. Such Viterbi decoders in which each clock pulse corresponds to processing of one event (e.g., decoding of a next bit) are referred to in the industry and herein as "1T" Viterbi decoders.

As the data rate (e.g., "baud" rate) for application of Viterbi decoders has increased, many present day decoders utilized a "2T" decoder structure such that each clock cycle decodes a sequence of two consecutive bits of the encoded symbol. Such a 2T decoder implementations has four possible transitions from a current state to a next state based upon a sensed the event representation of two encoded bits. Thus the clock rate of the Viterbi decoder state machine is typically half that of the data/baud rate of transmitted information. More generally, modern Viterbi decoders may utilize a clock rate that is an integer fraction of the corresponding data rate. In other words, an "nT" Viterbi decoder may use a clock that has a frequency of 1/n times the data rate. Thus each clock pulse in an nT Viterbi decoder represents n bits of the symbol to be decoded. Thus an nT Viterbi decoder is operable in accordance with an nT state machine.

Such nT state machines typically provide branch metric information for each of the four possible transitions from each state to a corresponding next state. Provision of such nT branch metric information makes application of SOVA techniques more complicated. The Hagenauer and Hoeher SOVA techniques presume that branch metric information, and hence state metric differences, are determinable for each sensed event such as in a 1T implementation of a Viterbi decoder. However, such information is not generally available in an nT implementation of a Viterbi decoder.

It is evident from the above discussion that an ongoing need exists to usefully apply SOVA techniques in an nT state machine implementation of a Viterbi decoder to provide 1T state metric difference information for the SOVA implementation.

SUMMARY

The present invention solves the above and other problems, thereby advancing the state of the useful arts, by providing methods and structure for determining 1T equivalent state metric difference information in an nT implementation of a Viterbi decoder. The 1T equivalent state metric difference information may then be utilized in well-known SOVA methods within the Viterbi decoder to produce higher quality reliability/probability information for the state metric information.

One aspect hereof provides a method in an nT Viterbi algorithm decoder having associated nT branch metric information for soft output reliability determination where n is an integer greater than 1. The method includes determining 1T equivalent branch metric information from the nT branch metric information. The method also includes using the 1T equivalent branch metric information to determine bit-wise soft output reliability information of the nT Viterbi decoder.

Another aspect hereof provides a method operable in an nT Viterbi decoder where n is an integer greater than 1. The method includes receiving a sequence of events representing an encoded symbol such that each event represents n bits of the encoded symbol. The method also includes operating a soft output Viterbi algorithm state machine in the decoder to decode the encoded symbol from the received sequence of events to generate a corresponding decoded symbol and to generate a bit-wise reliability value for each bit of the decoded symbol. The step of operating the soft output Viterbi algorithm state machine further includes generating the bit-wise reliability values for the decoded symbol by utilizing 1T equivalent branch metric information derived from nT branch metric information associated with the soft output Viterbi algorithm state machine.

Yet another aspect hereof provides a digital channel decoder including an nT soft output Viterbi element adapted to receive an input signal on each pulse of a corresponding clock signal. The received input signal representing a sequence of n bits of an encoded symbol. The Viterbi element is adapted to generate a most likely decoded symbol and adapted to generate a bit-wise reliability value for each bit of the decoded symbol. The nT soft output Viterbi algorithm element further includes nT branch metric information and a 1T state metric difference computation element for generating and accumulating 1T state metric difference information derived from the nT branch metric information.

DETAILED DESCRIPTION OF THE DRAWINGS

Figure 1:
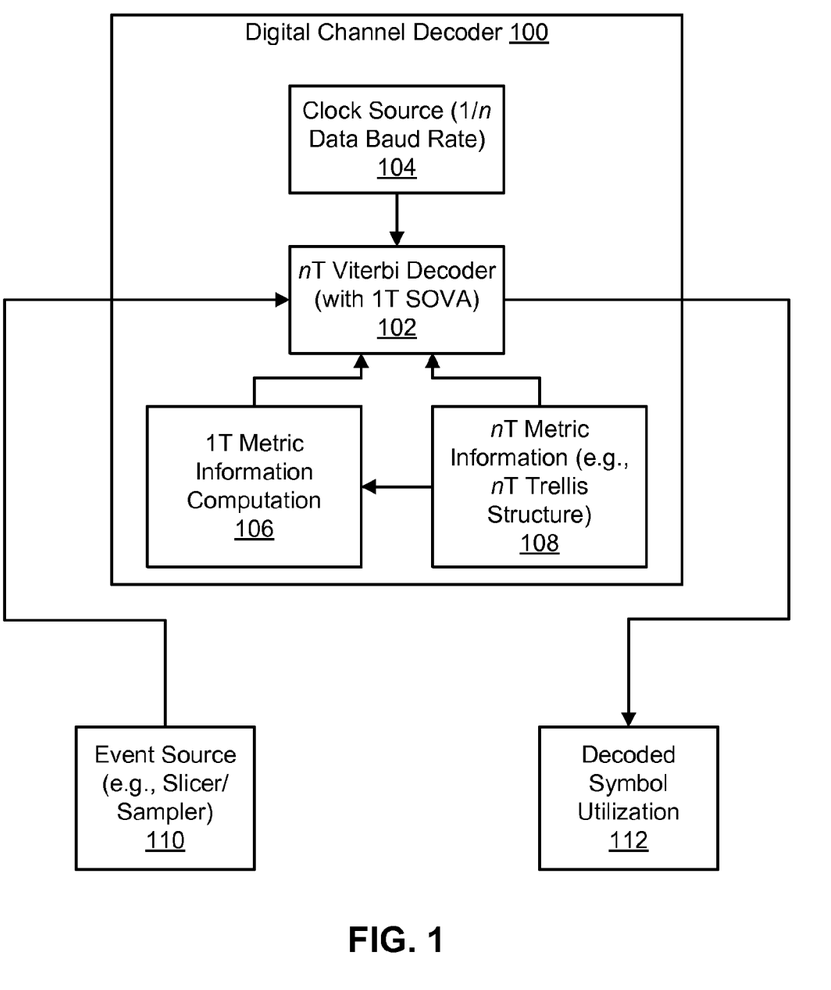
FIG. 1 is a block diagram of a system including a Viterbi decoder enhanced in accordance with features and aspects hereof to determine 1T metric information in an nT implementation of the decoder.

FIG. 1 is a block diagram of a system including a digital channel decoder 104 decoding received encoded symbols. Such a digital channel decoder may be utilized, for example, in a digital communication system receiving digitally encoded information from a transmitting device. Further, such a digital channel decoder is common in storage applications wherein a read head senses magnetic or optical modulations in a storage medium representing encoded symbols previously recorded by a write head operation. The sensed fluctuations in magnetic or optical properties are then sampled by an analog to digital conversion mechanism and forwarded to the digital channel decoder 104. Thus, digital channel decoder 100 is coupled to receive a sequence of sensed events from an event source 110. Such an event source is often referred to as a slicer or sampler and typically includes an analog to digital converter element ("ADC") along with discrete sampling logic. Further, event source 110 may also include suitable analog and/or digital filtration components to filter and/or equalize the sampled signals.

Digital channel decoder 100 may then be coupled to decoded symbol utilization element 112 to utilize, in the intended application, a next decoded symbol produced as output from digital channel decoder 100. For example, where the digital channel decoder is utilized for data or voice communication, the next decoded symbol utilization 112 may be for producing corresponding sound or other application of the received data. Or, for example, where the digital channel encoder 100 is applied in a storage device application, utilization element 112 may buffer the decoded symbol for eventual transmission to a requesting host system or for other processing internal to the storage device.

Digital channel decoder 100 may include a clock source 104 for generating a pulsed clock signal having an appropriate frequency. As is generally known for an nT decoder structure 100, the clock source preferably has a frequency of 1/n that of the data baud rate. In other words, the decoder mechanism is operable to detect n encoded bits of an encoded symbol on each clock pulse generated by clock source 104. The generated clock signal is applied to the nT Viterbi decoder element 102 operable in accordance with a state machine or other suitable, combinatorial and/or sequential logic to decode each received event as n encoded bits of an encoded symbol. Decoder element 102 utilizes a Viterbi algorithm and more specifically, in accordance with features and aspects hereof, combines elements of the nT structure of a typical Viterbi decoder with the enhanced features associated with a 1T soft output Viterbi algorithm (SOVA). Thus, decoder element 102 is adapted to decode n encoded bits of an encoded symbol on each clock pulse as is generally known for an nT Viterbi algorithm but is also enhanced to produce soft output including bit-wise reliability information generated in accordance with 1T metric information. Decoder 102 is therefore coupled to utilize nT metric information represented as element 108. In addition, decoder element 102 receives 1T metric information from element 106. The nT metric information 108 is, in essence, designed as an aspect of the decoder structure. Typically, a Viterbi decoder element 102 is implemented a state machine using combinatorial and/or sequential logic that may be most easily described in a so called Trellis structure or Trellis diagram. As discussed in further detail herein below, 1T metric computation element 106 determines 1T equivalent metric information from subtraction and addition computations applied to the nT metric information 108. But in other words, 1T metric computation element 106 determines equivalent metric information corresponding to a 1T Viterbi structure by identifying 1T metric values that sum to the corresponding nT metric information designed into the decoder 100 as element 108. Exemplary computations for an exemplary implementation of features and aspects of hereof are discussed further herein below.

Those of ordinary skill in the art will readily recognize numerous additional and/or equivalent elements in a fully functional digital channel decoder. Such additional and equivalent elements are eliminated in FIG. 1 for simplicity and brevity of this discussion. Thus, FIG. 1 is intended merely as a representative of a typical exemplary implementation of decoder 100.

Figure 2:
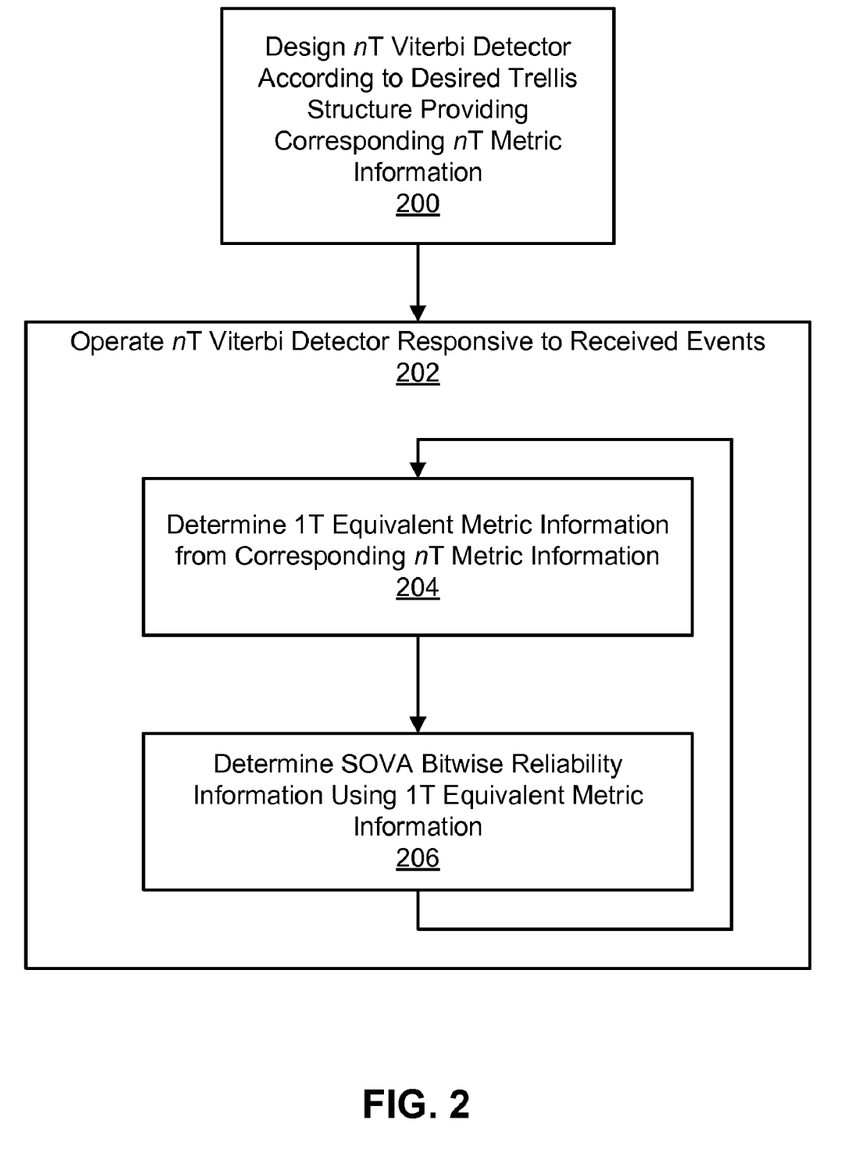
FIGS. 2 through 4 are flowcharts describing a method in accordance with features and aspects hereof to generate and utilize 1T metric information in an nT implementation of a Viterbi decoder.

FIG. 2 is a flowchart representing aspects of design and utilization of an nT Viterbi detector enhanced in accordance with features and aspects hereof to determine and utilize 1T equivalent metric information for use in soft output Viterbi algorithm bit-wise reliability computations. Element 200 represents a design process for the intended nT Viterbi detector structure according to a desired Trellis diagram descriptive of the desired decoding. Such a Viterbi detector design will inherently encode within it corresponding nT metric information. Thus, on each clock pulse applied to the Viterbi detector design, n bits of an encoded symbol will be effectively decoded in accordance with the nT metric information inherent in the Viterbi detector design. Thus, element 200 provides nT metric information for utilization by the Viterbi detector design.

Element 202 then represents operation or utilization of the Viterbi detector responsive to received events. In general, as noted above, element 202 represents utilization of the nT metric information to operate the Viterbi detector state machine logic and utilization of the nT metric information to determine and utilize 1T equivalent metric information for the computation of bit-wise reliability information. Element 202 therefore represents iterative performance of elements 204 and 206 within element 202. Element 204 generally represents processing to determine 1T equivalent metric information from the corresponding nT metric information associated the present state of processing of the Viterbi decoder. As discussed further herein below, the 1T equivalent metric information is determined as 1T metric values that sum to the current nT metric information associated with the current state of processing of the Viterbi decoder state machine. Element 206 and then utilizes the 1T equivalent metric information so determined by element 204 to determine the soft output Viterbi algorithm bit-wise reliability information corresponding to each decoded bit of the n bits to be decoded on this clock pulse. Processing of FIG. 2 therefore operates an nT Viterbi decoder structure in such a manner as to generate and utilize 1T equivalent metric information for SOVA related computations of bit-wise reliability information.

Figure 3:
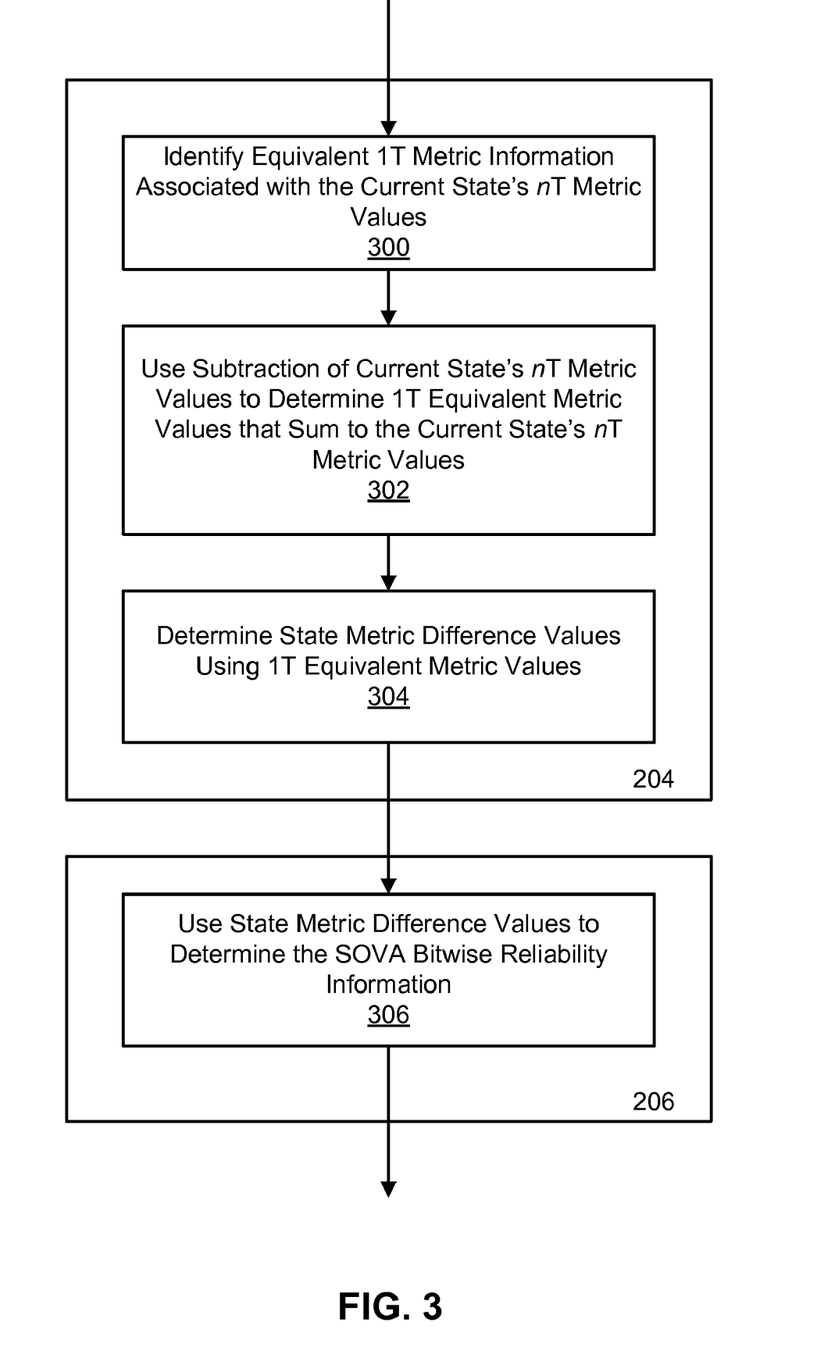

FIG. 3 is a flowchart providing additional exemplary details of processing of elements 204 and 206 of FIG. 2 above. As discussed above, element 204 is generally operable to determine 1T equivalent metric information from nT metric information corresponding to the current operating state of the nT Viterbi detector state machine logic. More specifically, element 300 is operable to identify equivalent 1T state metric information associated with nT metric information metric values associated with the current operating state of the nT Viterbi decoder. Element 302 more specifically utilizes arithmetic addition/subtraction of the current state's nT metric values to determine the 1T equivalent metric values that sum to the current state's nT metric values. Element 304 is then operable to determine state metric difference values utilizing the computed 1T equivalent metric values. As noted above, the state metric difference values are useful as an estimate of the log likelihood ratio ("LLR") useful in SOVA bit-wise reliability computations. Element 306 then utilizes such state metric difference values to determine the SOVA bit-wise reliability information for each of the n decoded bits generated by operation of the Viterbi detector in response to a clock pulse indicative of a sensed event.

Figure 4:
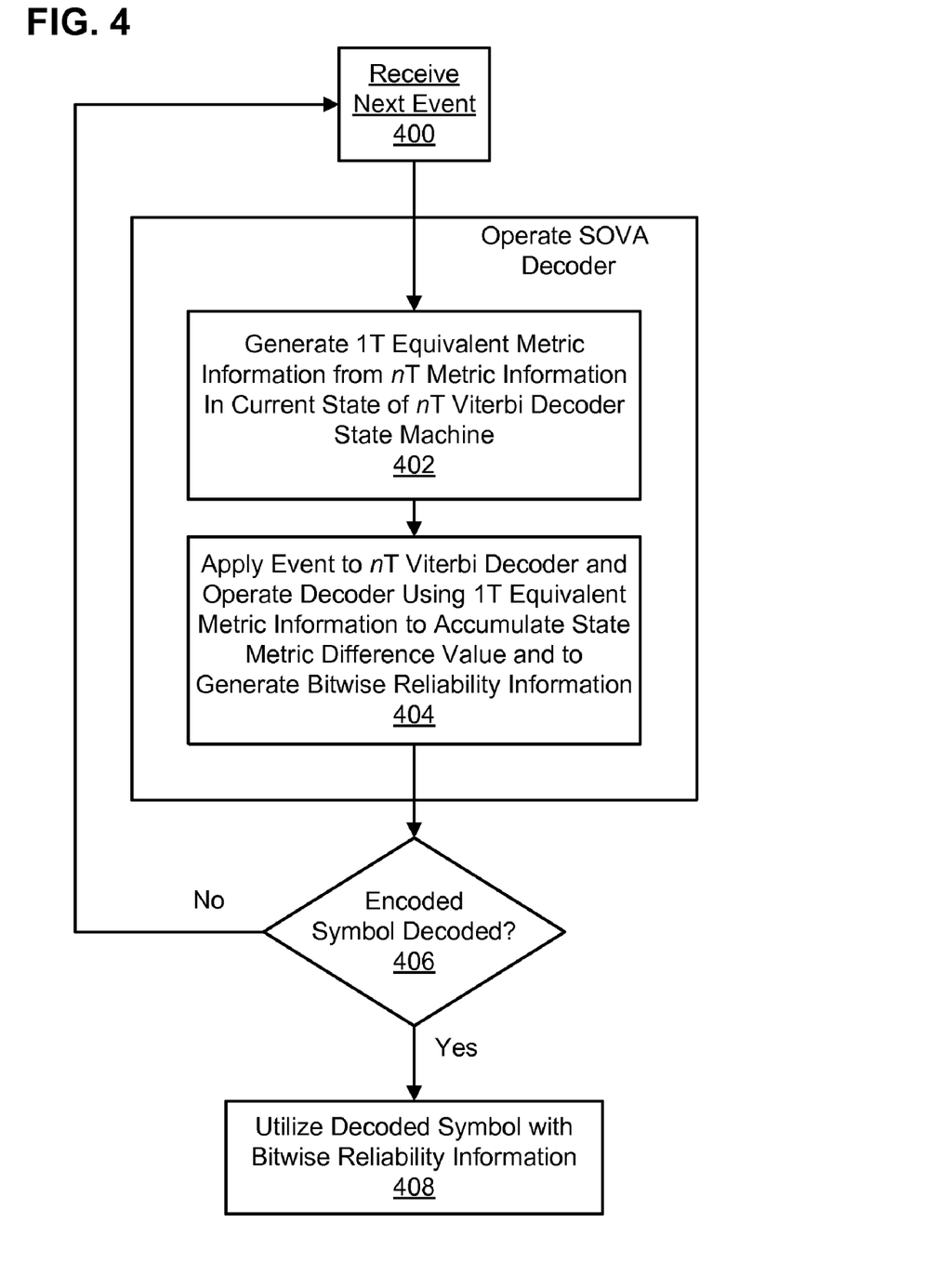

FIG. 4 is a flowchart describing an exemplary method in accordance with features and aspects hereof for operating an nT Viterbi decoder enhanced to generate bit-wise reliability information computed utilizing SOVA techniques based on 1T equivalent metric information. Elements 400 through 406 of FIG. 4 are iteratively operable to decode all bits of an encoded symbol. Each iteration of elements 400 through 406 represents decoding of n bits of the encoded symbol in response to a single clock pulse indicating a received next event.

Element 400 is first operable to await receipt of the next indicated event as indicated by the clock pulse. As noted above, the received event may be received from an attached slicer or sampling unit that samples and converts an analog signal into a corresponding digital value. In general, the Viterbi decoder then determines the most likely decoded symbol value corresponding to the received sequence of events. Elements 402 and 404 therefore represent operation of the nT Viterbi decoder responsive to the received event indicated by the receipt of a single clock pulse. In addition to standard operation of such an nT decoder to decode the most likely value of each of n bits corresponding to the received event, element 402 is operable to generate 1T equivalent metric information from the nT metric information corresponding to the current state of operation of the nT Viterbi decoder state machine. As noted above, 1T equivalent metric information is computed by arithmetic operations performed on the nT metric values associated with the current state of operation of the nT Viterbi decoder. Exemplary computations for such a determination are discussed further herein below. Element 404 then applies the received event to the nT Viterbi decoder as required to decode the encoded bits and further to utilize the 1T equivalent metric information to accumulate state metric difference values. As noted above, the accumulated state metric difference value may be utilized to generate bit-wise reliability information in accordance with SOVA techniques. Thus, despite the absence of 1T metric information in the nT Viterbi decoder design, features and aspects hereof dynamically generate or determine such 1T equivalent metric information as the nT Viterbi decoder is operable on each received event. Element 406 and then determines whether all bits of the encoded symbol have been decoded. If not, processing continues looping back to element 400 to await indication of receipt of the next event representing n additional encoded bits. If element 406 determines that the entire encoded symbol has been decoded, element 408 is operable to utilize the decoded symbol with the associated bit-wise reliability information.

Those of ordinary skill in the art will readily recognize numerous equivalent and additional method steps to those described above with respect to FIGS. 2 through 4. Such additional and equivalent method steps are eliminated for simplicity and brevity of this discussion. Thus FIGS. 2 through 4 are intended merely as representative of one exemplary embodiment of features and aspects hereof. Still further, the methods of FIGS. 2 through 4 are presented in general terms of an nT Viterbi decoder. Those of ordinary skill in the art will readily recognize use of these methods for any value of "n" greater than 1. A 2T implementation is common in present technology. 3T and 4T implementations are also presently known. Thus the methods of FIGS. 2 through 4 are easily adapted to any value of n greater than 1.

Figure 5:
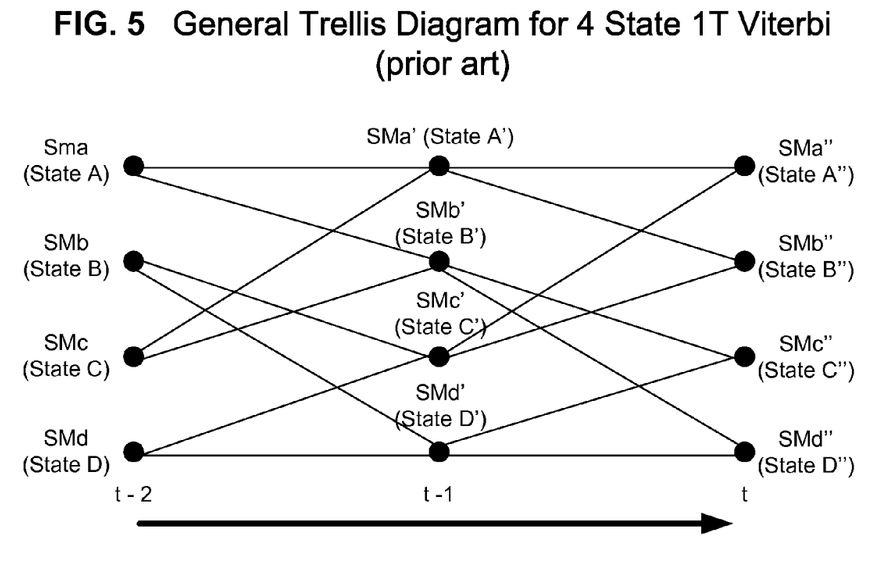
FIGS. 5 and 6 are Trellis diagrams describing operation of an exemplary 4-state, 1T implementation of a Viterbi decoder through a sequence of clock pulses.

As is well known in the art, Viterbi decoder is often expressed in terms of a Trellis diagram or figure representing the sequence of states and various transitions between the states. In general, each state has two transitions representing the likelihood of a particular decoded bit representing a zero value or a one value to transition to a corresponding next state. FIG. 5 is therefore a Trellis diagram representing a generalized 4-state, 1T Viterbi decoder as is generally known in the art. The Trellis diagram of FIG. 5 represents a sequence of four states at each of three discrete times each corresponding to a clock pulse (hence the 1T Viterbi design presented). A first set of states (A, B, C, and D) are represented by the current accumulated state metric values SMa, SMb, SMc, and SMd, all corresponding to a clock pulse at time T-2. The 1T Viterbi decoder represented by FIG. 5 may then transition along some path from its current state to a most likely next state in response to receipt of a clock pulse at time T-1 indicating receipt of a corresponding event. The state metric information for the set of possible next states (A', B', C', or D') is represented as accumulated state metric SMa', SMb', SMc', and SMd' all corresponding to time T-1. From this next state, each state may transition to a corresponding next state (A", B", C", or D") based on the likelihood of a next received event corresponding to a next clock pulse at time T. Hence at time T, the accumulated state metric information is represented as SMa", SMb", SMc", and SMd".

As is well known to those of ordinary skill in the art, the Trellis diagram of FIG. 5 represents each possible accumulated state metric difference value for the 4-state exemplary Viterbi decoder with two transitions to a next possible state. The transitions are represented by lines from an earlier state to a later state (directed according to the chronology T-2, T-1, and T). Each transition has an associated branch metric value that is utilized in determining the next state and hence the next state metric accumulated value (e.g., SMa', SMa", SMb' SMb", etc.).

Figure 6:
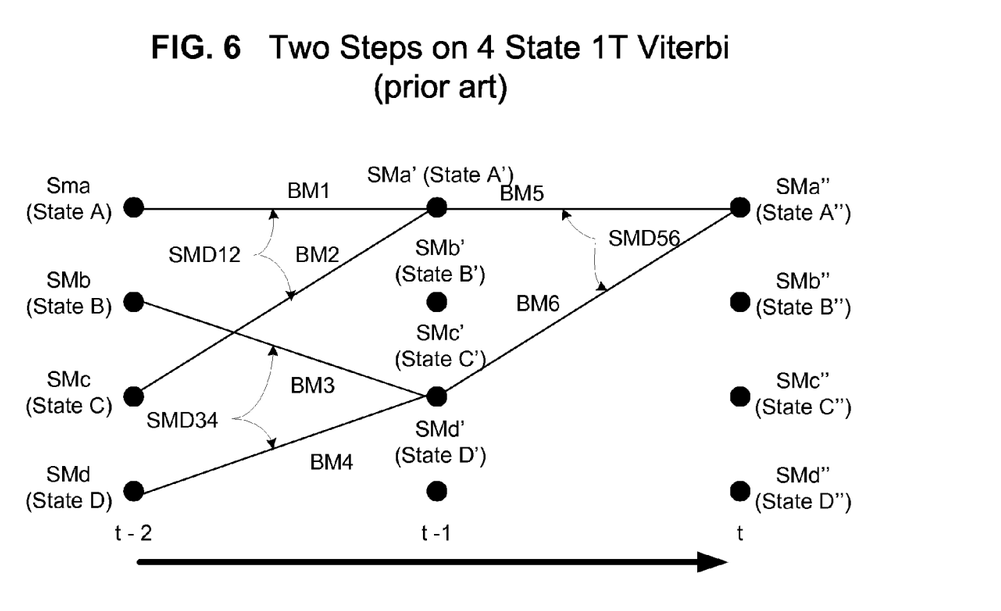

FIG. 6 represents two exemplary steps in time from the exemplary 4-state 1T Viterbi decoder of FIG. 5. Such a known 1T Viterbi decoder may be in one of four states at time T-2 (A, B, C, or D). Each state is represented by its current accumulated state metric value SMa, SMb, SMc, and SMd. In the exemplary steps of FIG. 6, a transition from state A with an accumulated state metric value of SMa at time T-2 to state A' with accumulated metric value SMa' at time T-1 corresponds to a branch metric value of BM1. A transition from state B represented by state metric value SMb to state C' with metric value SMc' corresponds to a branch metric value of BM3. The transition from state C with metric value SMc to state A' with metric value SMA' corresponds to a branch metric of BM2 and the transition from state D with a metric value SMd to state C with a metric value SMc' corresponds to a branch metric value of BM4. Moving forward to the next step depicted in FIG. 6 from time T-1 to time T, the transition from State A' (SMa') to state A" (SMa") corresponds to a branch metric value of BM5 while the transition from state C' (SMc') to state A" (SMa") corresponds to a branch metric value of BM6.

As discussed in the Hagenauer and Hoeher paper, the state metric difference value between the most likely next state in the second most likely next state is a suitable estimate or approximation of the log likelihood ratio ("LLR") used in computing the SOVA bit-wise reliability information. In the exemplary known 1T Viterbi decoder represented by the two Trellis diagrams of FIGS. 5 and 6, the decoder considers the current state of the Viterbi decoder state machine (e.g., states A, B, C, or D having respective state metric values SMa, SMb, SMc, or SMd) and the corresponding branch metric for each possible branch and then finds the minimum value to compute the next state metric values of the most likely next state and of the next most likely next state (A', B', C', or D').

For example, as shown in FIG. 6, state metric value SMa' in state A' is the minimum of the accumulated state metric from each of two possible paths to the state A', namely: from state A (SMa+BM1) and from state C (SMc+BM2); the two possible transitions into state A' represented by metric SMa'. In like manner, state C' having accumulated metric value SMc' may be determined as the minimum of: (SMb+BM3) from state B and (SMd+BM4) from state D. Continuing on to the next 1T clock pulse, SMa" at state A" may be determined as the minimum of (SMa'+BM5) from state A' and (SMc'+BM6) from state C'; the two possible paths leading to state A" represented by metric value SMa".

In practice such a minimum function may be implemented in combinatorial and/or sequential logic as a subtraction function. Thus the subtraction result is used to generate state metric difference ("SMD") information used to estimate the LLR in SOVA bit-wise reliability computations. The SMD information associated with the exemplary steps of FIG. 6 is shown as SMD12, the state metric difference between the two possible paths leading to state A'; SMD34, the state metric difference between the two possible path leading to the state C'; and SMD56, the state metric difference between the two paths leading two state A". In the example of FIG. 6, SMD12 may be computed as the absolute value difference between (SMa+BM1) and (SMc+BM2) (e.g. |(SMa+BM1)−(SMc+BM2)|); the two possible new state metric values leading to state A'. Similarly, SMD34 may be computed as the absolute value difference between (SMb+BM3) and (SMd+BM4) (e.g. |(SMb+BM3)−(SMd+BM4)|); the two possible new state metric values leading to state C'. Lastly, SMD56 may be computed as the absolute value difference between (SMa'+BM5) and (SMc'+BM6) (e.g., |(SMa'+BM5)−(SMc'+BM6)|); the two possible state metric values leading to state A" from state A' or from state C'.

As noted above, in a presently known typical 2T Viterbi decoder (or nT decoder in broader aspects hereof), no state or branch metric information is provided for the intermediate transition between, for example, time T-2 and time T. Rather, clock pulses are received at half (or 1/n times) the data rate and thus as presently practiced there is no intermediate computation for information associated with time T-1. Rather, each clock pulse for the slower frequency clock rate corresponds to receipt of an event representing two (or n) encoded bits rather than a single encoded bit of a 1T implementation. Thus as presently practiced in the art, it is difficult to implement SOVA bit-wise reliability computations in a standard 2T Viterbi decoder (or an nT decoder).

Figure 7:
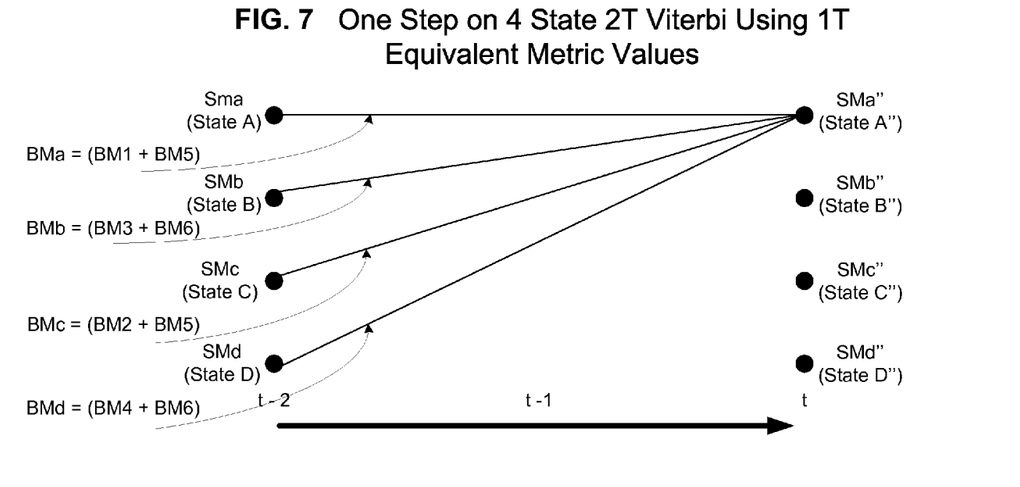
FIG. 7 is a Trellis diagram describing operation of a 2T implementation of a Viterbi decoder enhanced to determine 1T equivalent metric information from the 2T metric information associated with the 2T Viterbi decoder implementation.

FIG. 7 is a Trellis diagram depicting an exemplary single step on an exemplary four state 2T Viterbi decoder enhanced in accordance with features and aspects hereof to utilize 1T equivalents state metric information. First, FIG. 7 also shows the problem to be resolved in presently known 2T Viterbi decoder designs. Specifically, in a standard 2T Viterbi decoder, a transition from any of the states A, B, C, or D having corresponding accumulated metric values SMa, SMb, SMc, or SMd at time T-2 into state A" having accumulated metric value SMa" at time T provides no branch metric information for intermediate steps corresponding to the clock pulse at time T-1 -obviously because there is no clock pulse at time T-1 and hence no need to decode a bit of the encoded symbol. However, in accordance with features and aspects hereof, the branch metric value BMa corresponding to the transition from state A with metric value SMa to state A" having metric value SMa" may be determined as the sum of two 1T equivalent branch metric values, namely BM1 plus BM5 as described above with respect to FIG. 6. In like manner BMb. representing the 2T branch metric on the transition from state B with metric value SMb to state A" with metric value SMa" may be represented as the sum of 1T equivalent metric values BM3 plus BM6. Still further, BMc representing the branch metric value of the transition from state C having metric value SMc to state A" having metric value SMa" may be represented as the sum of 1T equivalent metric values BM2 plus BM5 and BMd in like manner may be represented as the sum of BM4 plus BM6.

A 2T implementation Viterbi decoder finds the minimum of four possible next state metric values (i.e., the minimum of (SMa+BMa), (SMb+BMb), (SMc+BMc), and (SMd+BMd)—the four possible transition paths into the next state A" having metric value SMa"). Since a standard 2T Viterbi decoder implementation does not require or provide intermediate 1T equivalent branch metric values corresponding to transitions from T-2 to T-1 and from T-1 to T, the corresponding state metric difference values are not provided. However, in accordance with features and aspects hereof, 1T equivalent metric information may be determined from the provided 2T metric information to allow computation of state metric difference information associated with each decoded bit to thereby permit SOVA techniques to generate bit-wise reliability information from the state metric difference values.

Features and aspects hereof note that in FIG. 6:

$$SMD12=(SMa+BM1)-(SMc+BM2))$$

while in FIG. 7 it is noted that:

$$BMa=BM1+BM5 \text{ and } BMc=BM2+BM5$$

so we can calculate a state metric difference between the path from SMa (state A) to SMa" (state A") and the path from SMc (state C) to SMa" (state A") as:

$$SMDx=(SMa+BM1+BM5)-(SMc+BM2+BM5)$$

which is equal to SMD12. Further we note that in FIG. 6:

$$SMD34=(SMb+BM3)-(SMd+BM4)$$

while in FIG. 7 it is noted that:

$$BMb=(BM3+BM6) \text{ and } BMd=(BM4+BM6)$$

so we can calculate a state metric difference between the path from SMb (state B) to SMa" (state A") and the path from SMd (state D) to SMa" (state A") as:

$$SMDy=(SMb+BM3+BM6)-(SMd+BM4+BM6)$$

which is equal to SMD34 in FIG. 6.

Thus SMDx may be computed equal to SMD12 based on 1T equivalent metric values derived from 2T metrics BMa and BMc and SMDy may be computed equal to SMD34 based on 1T equivalent metric values derived from 2T metrics BMb and BMd.

SMD568 may then be computed from these values as:

$$SMD56=|\min(SMa+BMa,SMC+BMc)-\min(SMb+BMb,SMd+BMd)$$

In addition, logic of the decoder must select whether SMD12 or SMD34 is presented as the estimated LLR value for the SOVA computations at the 1T equivalent of time T-1. If either (SMa+BMa) or (SMc+BMc) is the minimum metric path to state A having metric value SMa", then SMD12 as computed above is presented as the LLR estimate for SOVA computations at time T-1. Otherwise, SMD34 is presented as the LLR estimate for time T-1.

Those of ordinary skill in the art will readily recognize exemplary combinatorial and/or sequential logic to be added to the functional design of a 2T Viterbi decoder to provide the above computations. Further, those of ordinary skill in the art will readily recognize extensions to the above computations and related logic implementations to provide such 1T metric information for any nT Viterbi decoder implementation where n is greater than 1. For example, in a 3T implementation, 1T equivalent metric information may be derived for intermediate times T-1, T-2, and T-3. More generally, in an nT Viterbi decoder implementation, features and aspects hereof may compute 1T equivalent metric information for any intermediate bit times between a time T and an earlier time T-n.

Still further, those of ordinary skill in the art will readily recognize extensions to the above exemplary embodiments to extend the structure to any number of states. Frequently Viterbi decoders represented as a state machine implementing Trellis diagram logic implement a number of states that is a power of 2. Some Viterbi implementations reduce the total number of states by trimming or pruning paths known to be of no use in the particular decoder application. Those of ordinary skill in the art will readily recognize extensions to the above exemplary embodiments to permit such pruning or trimming of un-needed states.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. A method operable in a circuit associated with an nT Viterbi algorithm decoder circuit having associated nT branch metric information for soft output reliability determination where n is an integer greater than 1, the method comprising:

determining 1T equivalent branch metric information derived from the nT branch metric information; and     using the 1T equivalent branch metric information to determine bit-wise soft output reliability information of the nT Viterbi decoder.

2. The method of claim 1 wherein the step of determining 1T equivalent branch metric information further comprises:

determining 1T equivalent branch metric information for each nT branch metric value of the nT branch metric information as multiple 1T branch metric values that sum to a corresponding said each nT branch metric value.

3. The method of claim 2 wherein the step of determining 1T equivalent branch metric information for each nT branch metric value further comprises:

determining 1T equivalent branch metric information for each nT branch metric value of the nT branch metric information as n 1T branch metric values that sum to a corresponding said each nT branch metric value.

4. The method of claim 1 wherein the nT Viterbi algorithm decoder is a 2T Viterbi algorithm decoder, wherein the nT branch metric information is 2T branch metric information, and wherein the step of determining 1T equivalent branch metric information further comprises:

determining 1T equivalent branch metric information for each 2T branch metric value of the 2T branch metric information as two 1T branch metric values that sum to a corresponding said each 2T branch metric value.

5. The method of claim 1 wherein the step of using the 1T equivalent branch metric information further comprises:

using the 1T equivalent branch metric information to determine 1T state metric difference information; and     using the 1T state metric difference information to determine the soft output bit-wise reliability information of the nT Viterbi algorithm decoder.

6. A method operable in a circuit associated with an nT Viterbi decoder circuit wherein n is an integer greater than 1, the method comprising:

receiving a sequence of events representing an encoded symbol wherein each event represents n bits of the encoded symbol; and operating a soft output Viterbi algorithm state machine in the decoder to decode the encoded symbol from the received sequence of events to generate a corresponding decoded symbol and to generate a bit-wise reliability value for each bit of the decoded symbol, wherein the step of operating the soft output Viterbi algorithm state machine further comprises:

generating said bit-wise reliability values for the decoded symbol by utilizing 1T equivalent branch metric information derived from nT branch metric information associated with the soft output Viterbi algorithm state machine.

7. The method of claim 6
wherein the step of generating said bit-wise reliability value further comprises:

generating n state metric difference values at time "T" representing the difference between state metric values at time each preceding time "T-1" through "T-n"; and accumulating the n state metric difference values to generate said bit-wise reliability values.

8. The method of claim 6
wherein the nT Viterbi decoder is a 2T Viterbi decoder, and wherein the step of generating said bit-wise reliability value further comprises:

generating state metric difference values at time "T" representing the difference between state metric values at time "T-1" and at time "T-2"; and accumulating the state metric difference values to generate said bit-wise reliability values.

9. A digital channel decoder circuit comprising:

an nT soft output Viterbi element adapted to receive an input signal on each pulse of a corresponding clock signal, the received input signal representing a sequence of n bits of an encoded symbol, the Viterbi element adapted to generate a most likely decoded symbol and adapted to generate a bit-wise reliability value for each bit of the decoded symbol, wherein the nT soft output Viterbi algorithm element further comprises:

nT branch metric information; and a 1T state metric difference computation element for generating and accumulating 1T state metric difference information derived from the nT branch metric information.

10. The decoder of claim 9 wherein the nT soft output Viterbi algorithm element is a 2T soft output Viterbi algorithm element and further comprises:

2T branch metric information; and a 1T state metric difference computation element for generating and accumulating 1T state metric difference information derived from the 2T branch metric information.

* * * * *